US008692129B2

(12) United States Patent
Kasai et al.

(10) Patent No.: US 8,692,129 B2
(45) Date of Patent: Apr. 8, 2014

(54) PACKAGE-SUBSTRATE-MOUNTING PRINTED WIRING BOARD AND METHOD FOR MANUFACTURING THE SAME

(75) Inventors: Toshiaki Kasai, Ogaki (JP); Takema Adachi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 190 days.

(21) Appl. No.: 13/429,764

(22) Filed: Mar. 26, 2012

(65) Prior Publication Data

US 2012/0247823 A1 Oct. 4, 2012

Related U.S. Application Data

(60) Provisional application No. 61/470,006, filed on Mar. 31, 2011.

(51) Int. Cl.
*H05K 1/03* (2006.01)
*H05K 1/11* (2006.01)
*H05K 7/00* (2006.01)
*H05K 3/00* (2006.01)
*H05K 3/10* (2006.01)

(52) U.S. Cl.
USPC ........... 174/255; 174/261; 174/267; 361/760; 361/783; 29/829; 29/846

(58) Field of Classification Search
USPC .......... 174/261, 267, 255; 361/760, 783, 790; 29/829, 846
See application file for complete search history.

(56) References Cited

U.S. PATENT DOCUMENTS

| 2006/0245139 | A1* | 11/2006 | Kariya | 361/272 |
| 2007/0013049 | A1* | 1/2007 | Asai et al. | 257/700 |
| 2007/0096327 | A1* | 5/2007 | Kawamura et al. | 257/774 |
| 2007/0273047 | A1* | 11/2007 | Nakai et al. | 257/784 |
| 2009/0231820 | A1* | 9/2009 | Tanaka | 361/764 |
| 2010/0123235 | A1 | 5/2010 | Kim et al. | |
| 2011/0036620 | A1* | 2/2011 | Lin | 174/256 |
| 2011/0175235 | A1* | 7/2011 | Horiuchi et al. | 257/774 |

* cited by examiner

*Primary Examiner* — Timothy Thompson
*Assistant Examiner* — Sherman Ng
(74) *Attorney, Agent, or Firm* — Oblon, Spivak, McClelland, Maier & Neustadt, L.L.P.

(57) ABSTRACT

A printed wiring board includes an interlayer insulation layer, first pads positioned to mount a semiconductor element and forming a first pad group on the insulation layer, second pads forming a second pad group on the insulation layer and positioned along a peripheral portion of the first group, a first solder-resist layer formed on the insulation layer and having first openings exposing the first pads, respectively, and second openings exposing the second pads, respectively, conductive posts formed on the second pads through the second openings of the first solder-resist layer, respectively, and a second solder-resist layer formed on the first solder-resist layer and having a third opening exposing the first pads and fourth openings exposing surfaces of the posts, respectively. The second openings have a diameter greater than a diameter of the posts, and the second solder-resist layer is filling gaps formed between the second openings and the posts.

20 Claims, 15 Drawing Sheets

(A)

(B)

(C)

(A)

(B)

(C)

(A)

(B)

PACKAGE-SUBSTRATE-MOUNTING PRINTED WIRING BOARD AND METHOD FOR MANUFACTURING THE SAME

CROSS-REFERENCE TO RELATED APPLICATIONS

The present application is based on and claims the benefit of priority to U.S. Application No. 61/470,006, filed Mar. 31, 2011, the entire contents of which are incorporated herein by reference.

BACKGROUND OF THE INVENTION

1. Field of the Invention

The present invention relates to a package-substrate-mounting printed wiring board for mounting an upper package substrate of a package-on-package substrate, and to a method for manufacturing such a printed wiring board.

2. Discussion of the Background

US 2010/0123235 A1 describes a package-substrate-mounting printed wiring board for mounting an upper package substrate where a second pad is formed on a first pad for connecting the upper package substrate. The entire contents of this publication are incorporated herein by reference.

SUMMARY OF THE INVENTION

According to one aspect of the present invention, a printed wiring board includes an interlayer insulation layer, first pads positioned to mount a semiconductor element and forming a first pad group on the interlayer insulation layer, second pads forming a second pad group on the interlayer insulation layer and positioned along a peripheral portion of the first pad group, a first solder-resist layer formed on the interlayer insulation layer and having first opening portions exposing portions of the first pads, respectively, and second opening portions exposing portions of the second pads, respectively, conductive posts formed on the second pads through the second opening portions of the first solder-resist layer, respectively, and a second solder-resist layer formed on the first solder-resist layer and having a third opening portion exposing the first pads and fourth opening portions exposing surface portions of the conductive posts, respectively. The second opening portions have a diameter which is set greater than a diameter of the conductive posts, and the second solder-resist layer is filling gaps formed between the second opening portions and the conductive posts.

According to another aspect of the present invention, a method for manufacturing a printed wiring board includes forming on an interlayer insulation layer first pads positioned to mount a semiconductor element such that the first pads form a first pad group, forming second pads along a peripheral portion of the first pad group such that the second pads form a second pad group on the interlayer insulation layer, forming on the interlayer insulation layer a first solder-resist layer having first opening portions such that the first opening portions expose at least portions of the first pads, respectively, and second opening portions such that the second opening portions expose at least portions of the second pads, respectively, forming conductive posts on the second pads through the second opening portions of the first solder-resist layer, respectively, and forming on the first solder-resist layer a second solder-resist layer having a third opening portion such that the third opening portion exposes the first pad group and fourth opening portions such that the fourth opening portions expose surface portions of the conductive posts, respectively. The second opening portions have a diameter which is set greater than a diameter of the conductive posts, and the forming of the second solder-resist layer includes filling gaps formed between the second opening portions and the conductive posts.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
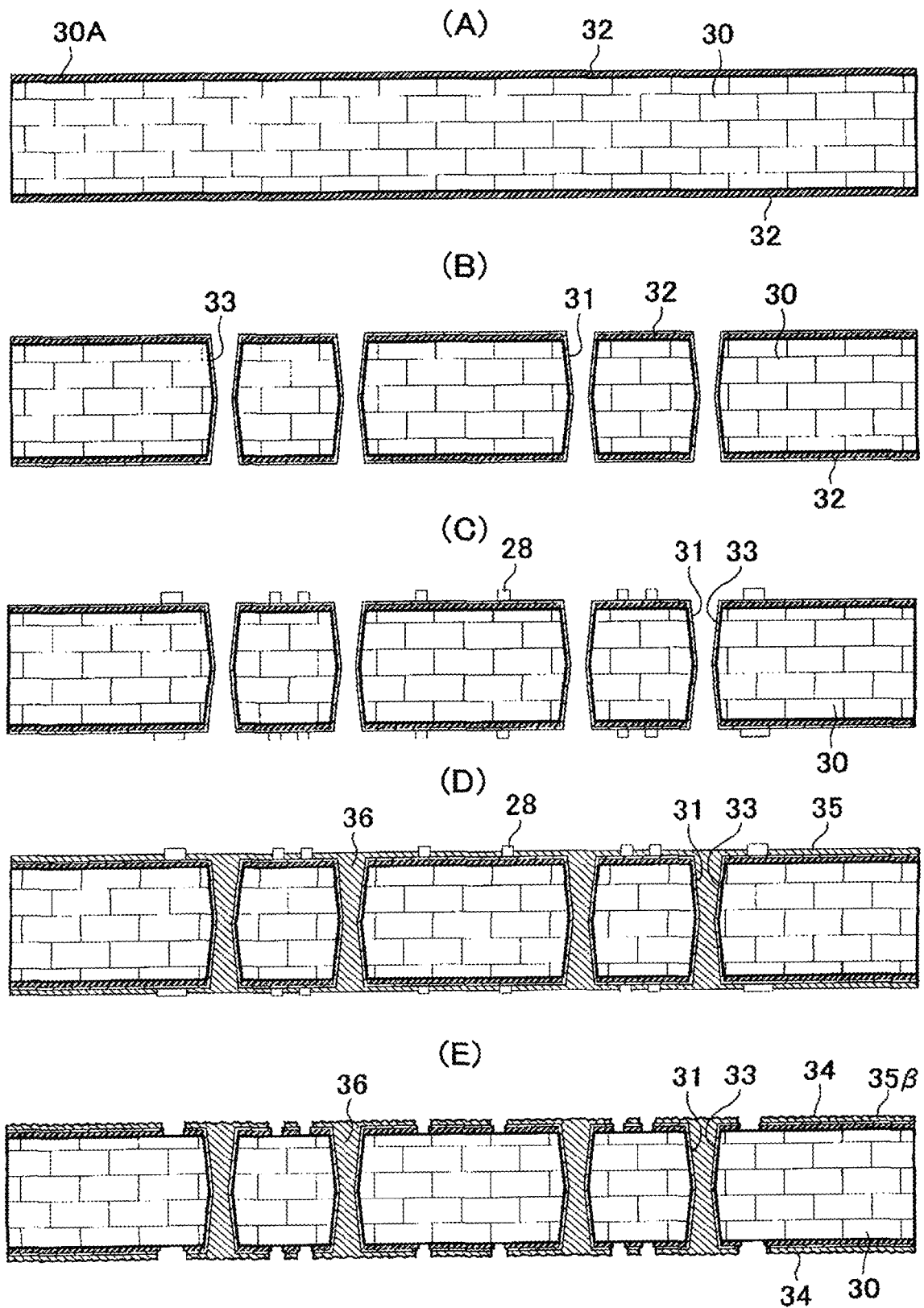
FIGS. 1(A)-1(E) are views of steps showing a method for manufacturing a package-substrate- mounting printed wiring board according to a first example of the present invention.
Figure 2:
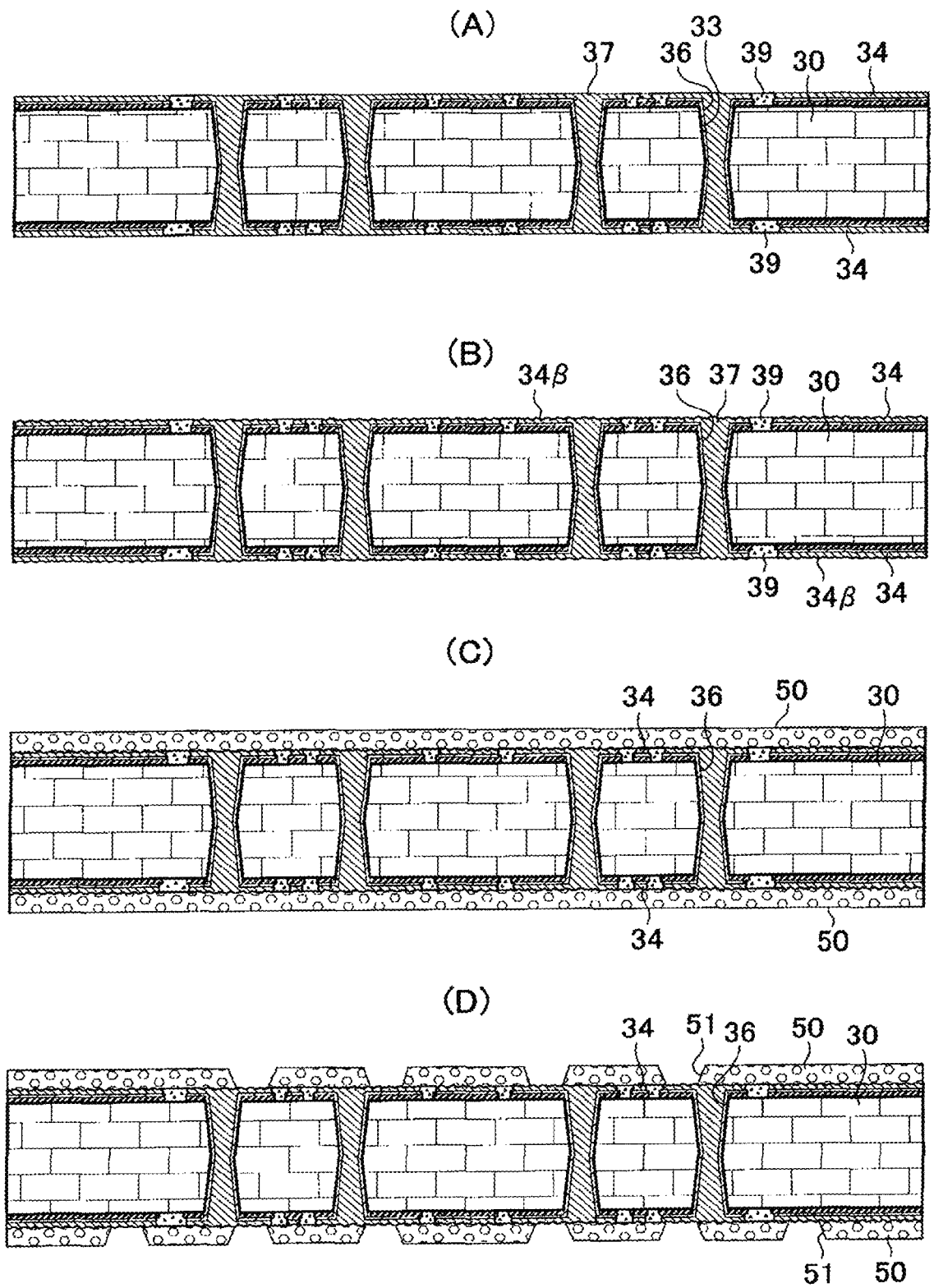
FIGS. 2(A)-2(D) are views of steps showing the method for manufacturing a package-substrate-mounting printed wiring board according to the first example.
Figure 3:
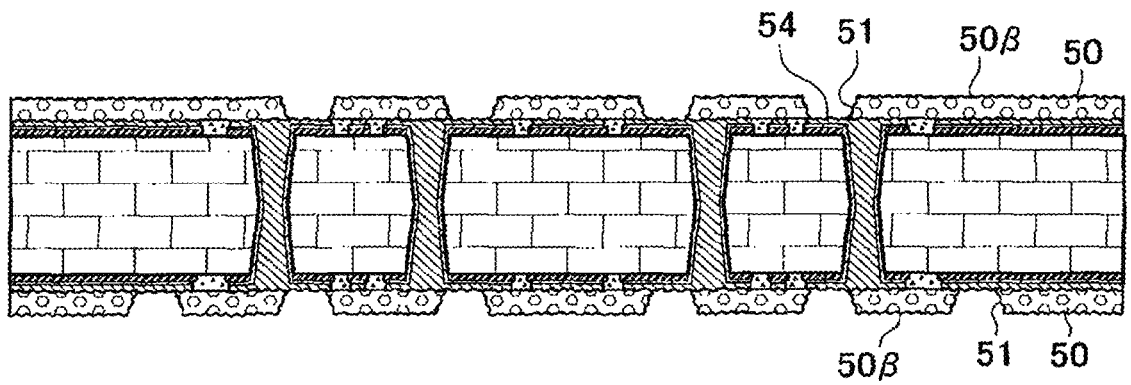
FIGS. 3(A)-3(C) are views of steps showing the method for manufacturing a package-substrate-mounting printed wiring board according to the first example.
Figure 3:
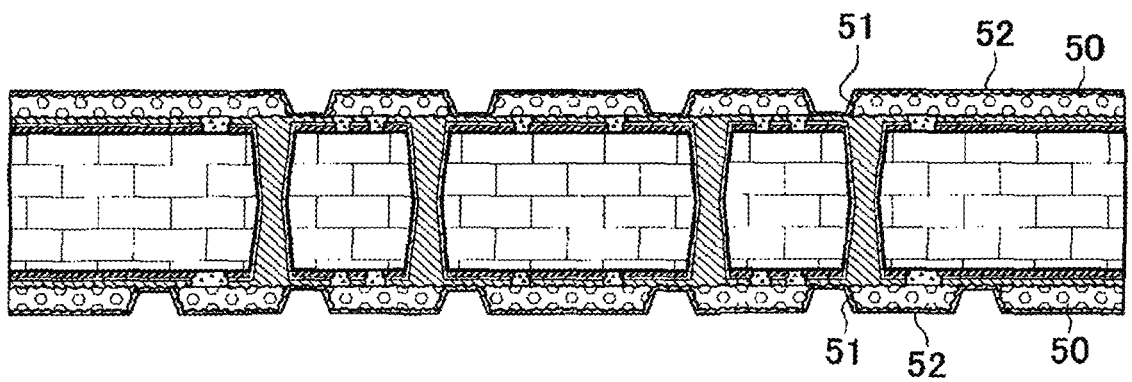
Figure 3:
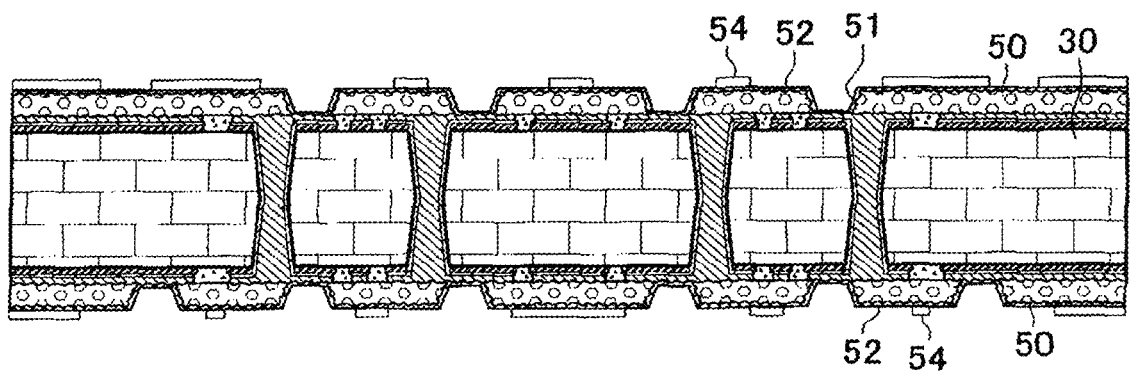
Figure 4:
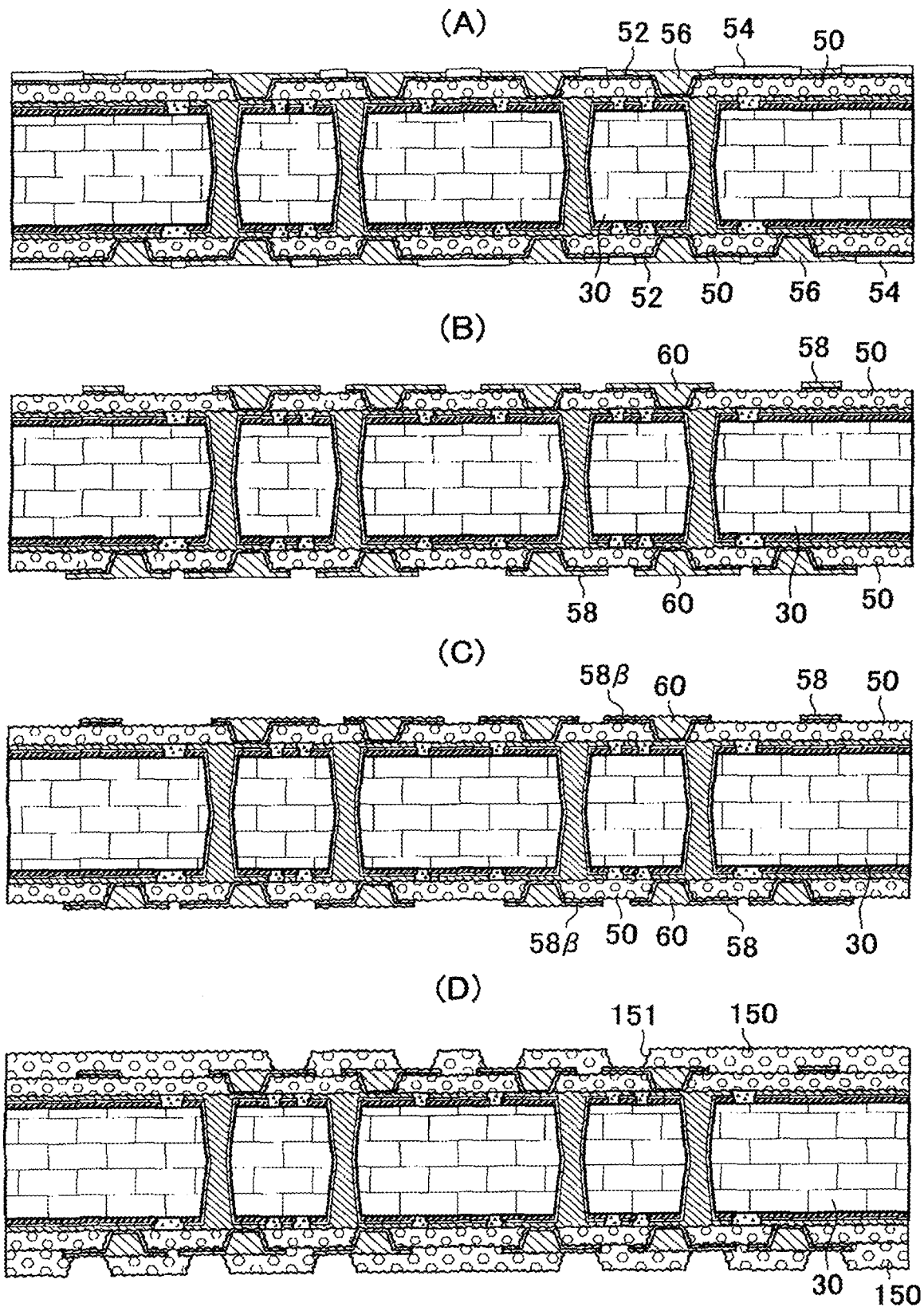
FIGS. 4(A)-4(D) are views of steps showing the method for manufacturing a package-substrate-mounting printed wiring board according to the first example.
Figure 5:
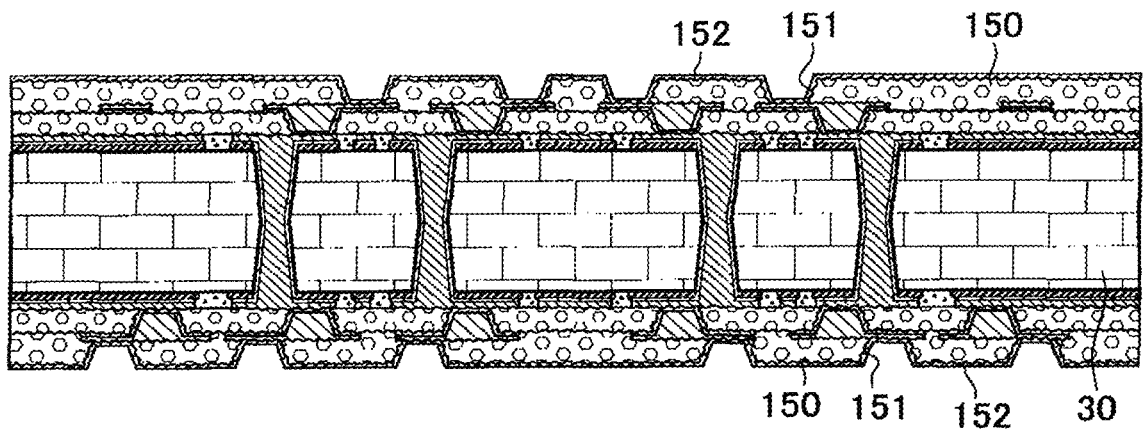
FIGS. 5(A)-5(C) are views of steps showing the method for manufacturing a package-substrate-mounting printed wiring board according to the first example.
Figure 5:
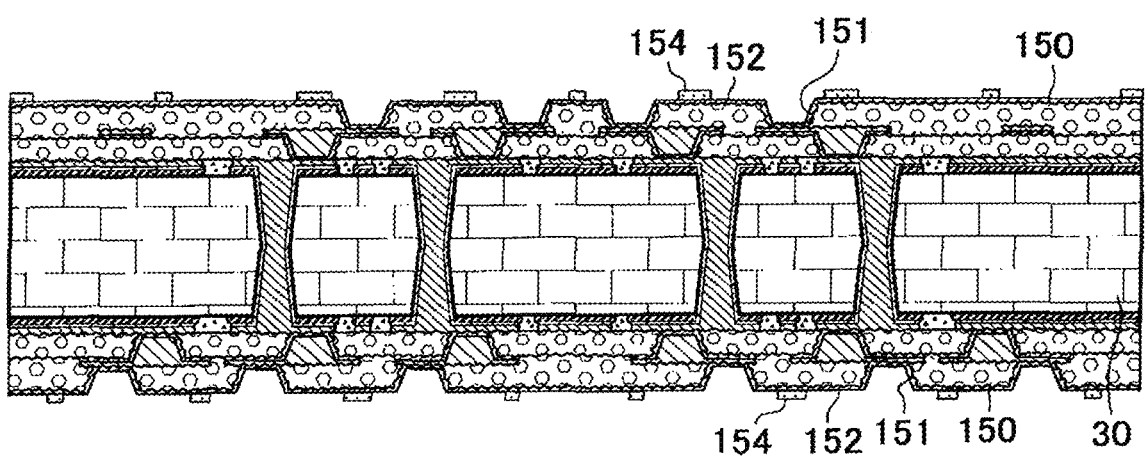
Figure 5:
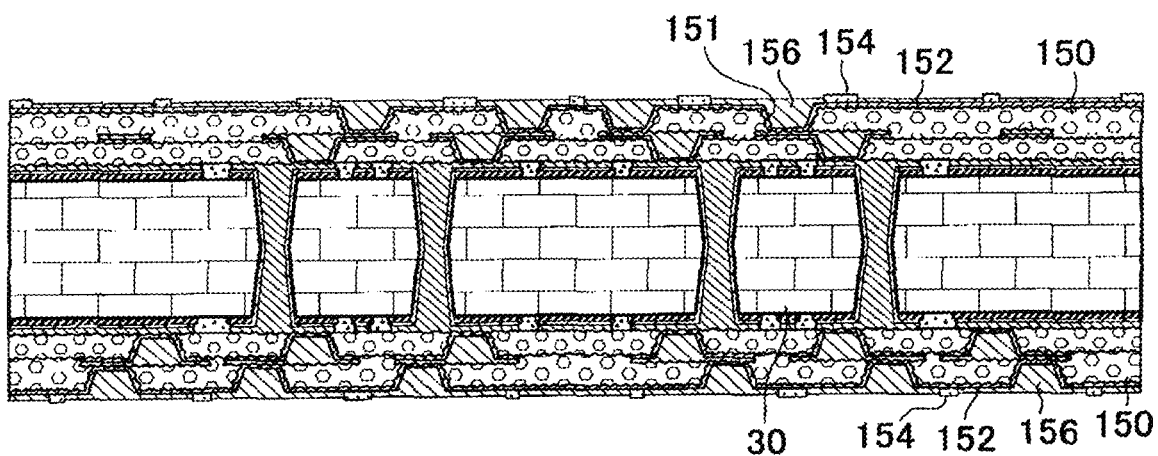
Figure 6:
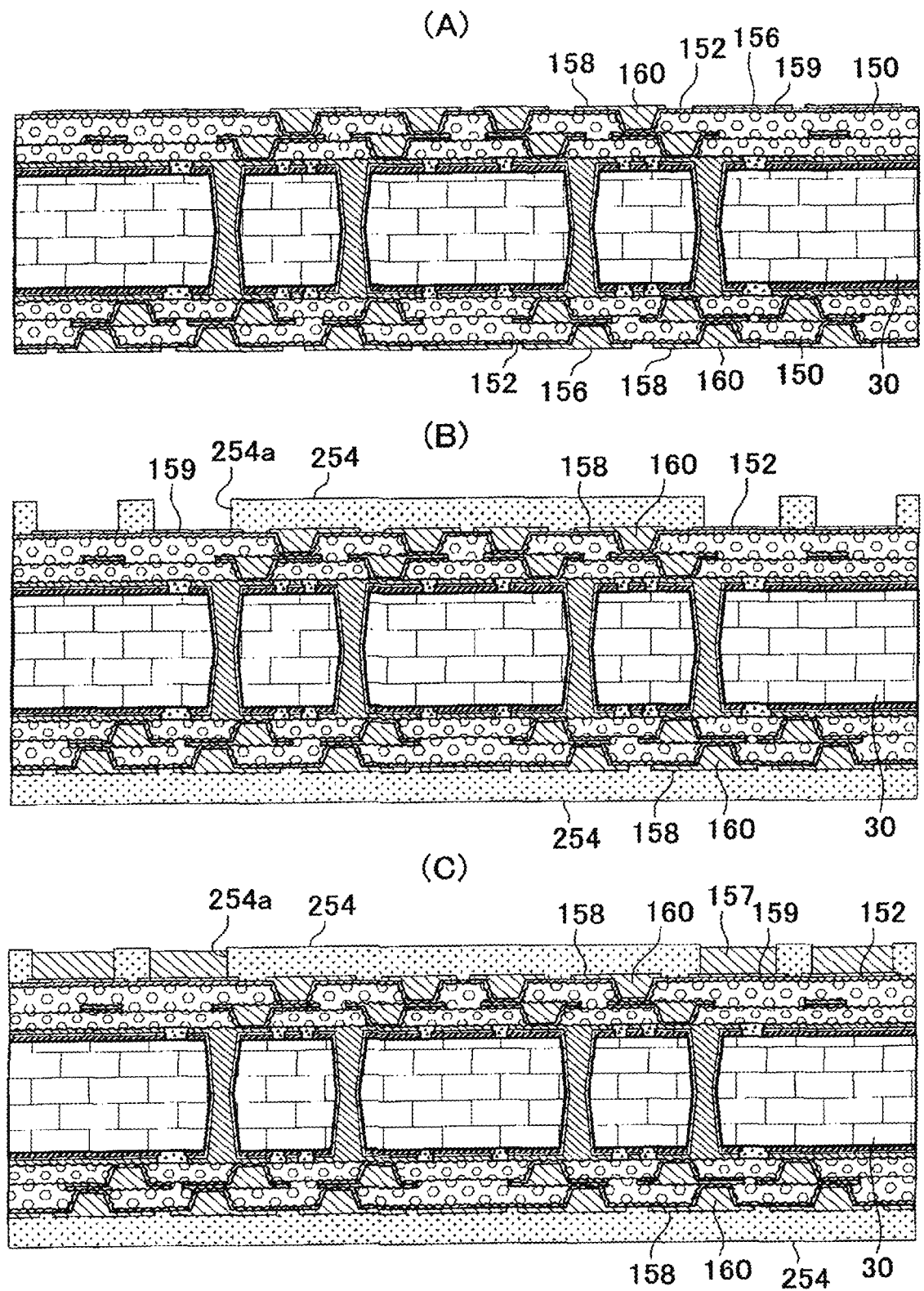
FIGS. 6(A)-6(C) are views of steps showing the method for manufacturing a package-substrate-mounting printed wiring board according to the first example.
Figure 7:
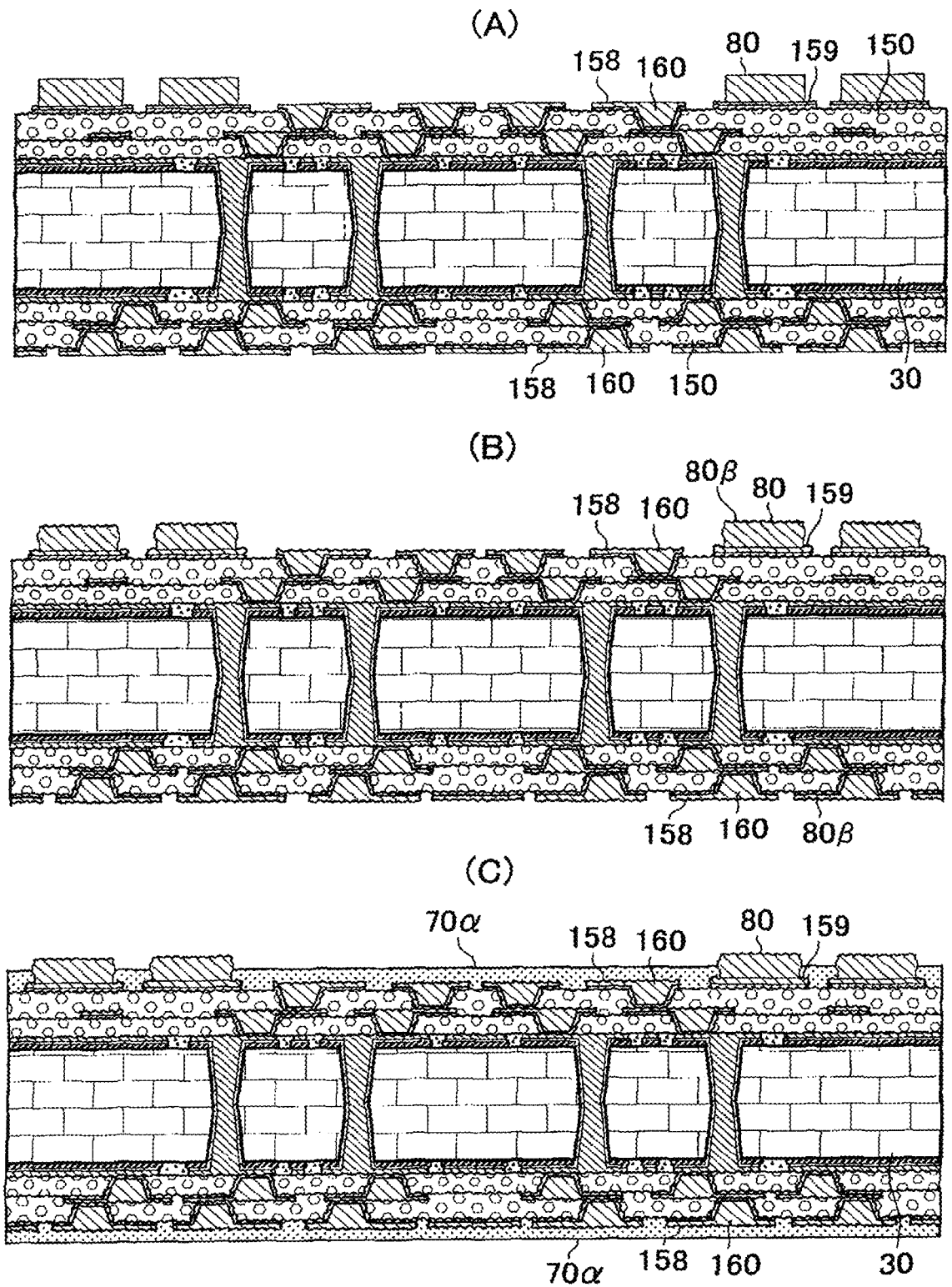
FIGS. 7(A)-7(C) are views of steps showing the method for manufacturing a package-substrate-mounting printed wiring board according to the first example.
Figure 8:
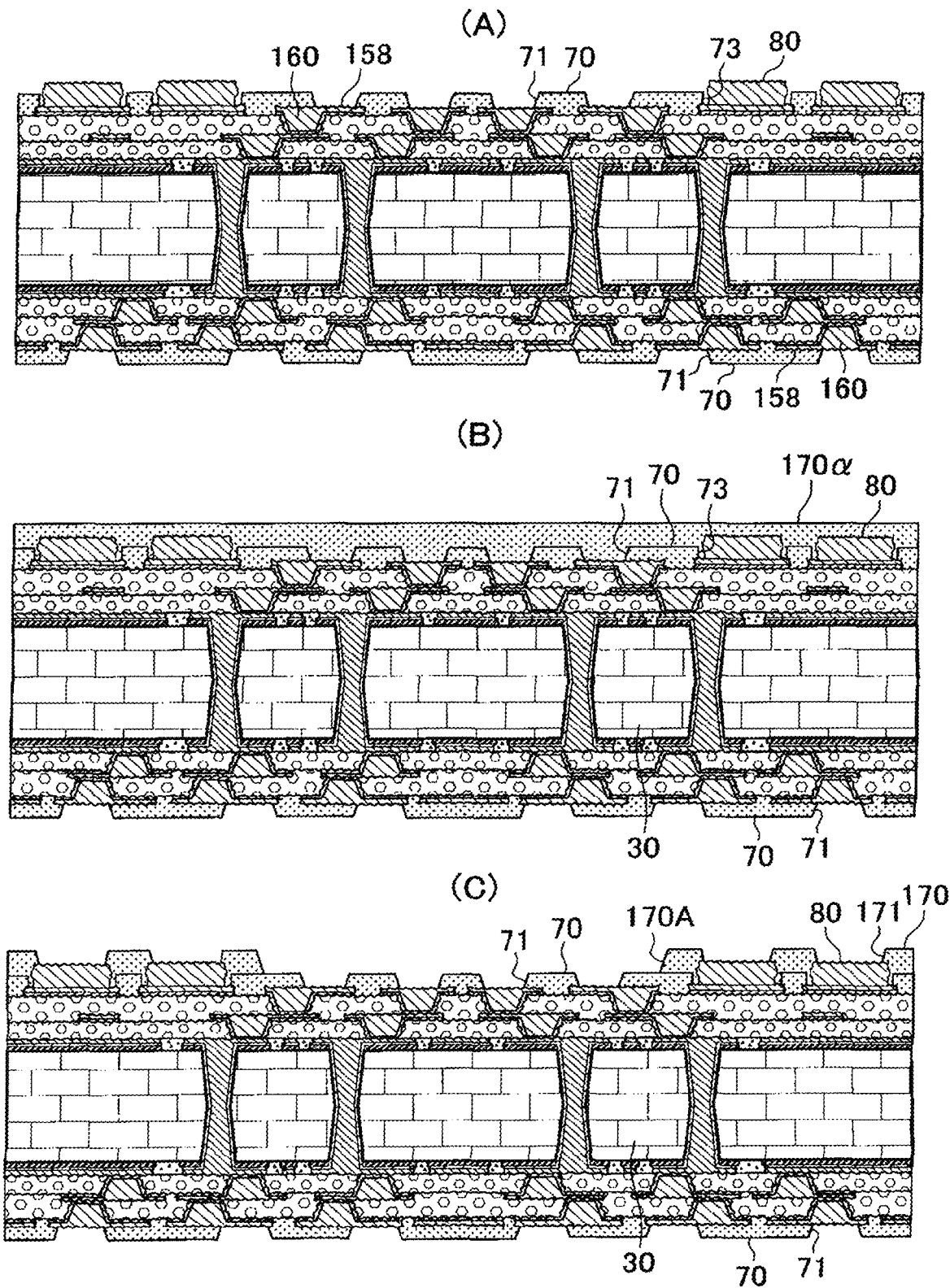
FIGS. 8(A)-8(C) are views of steps showing the method for manufacturing a package-substrate-mounting printed wiring board according to the first example.
Figure 9:
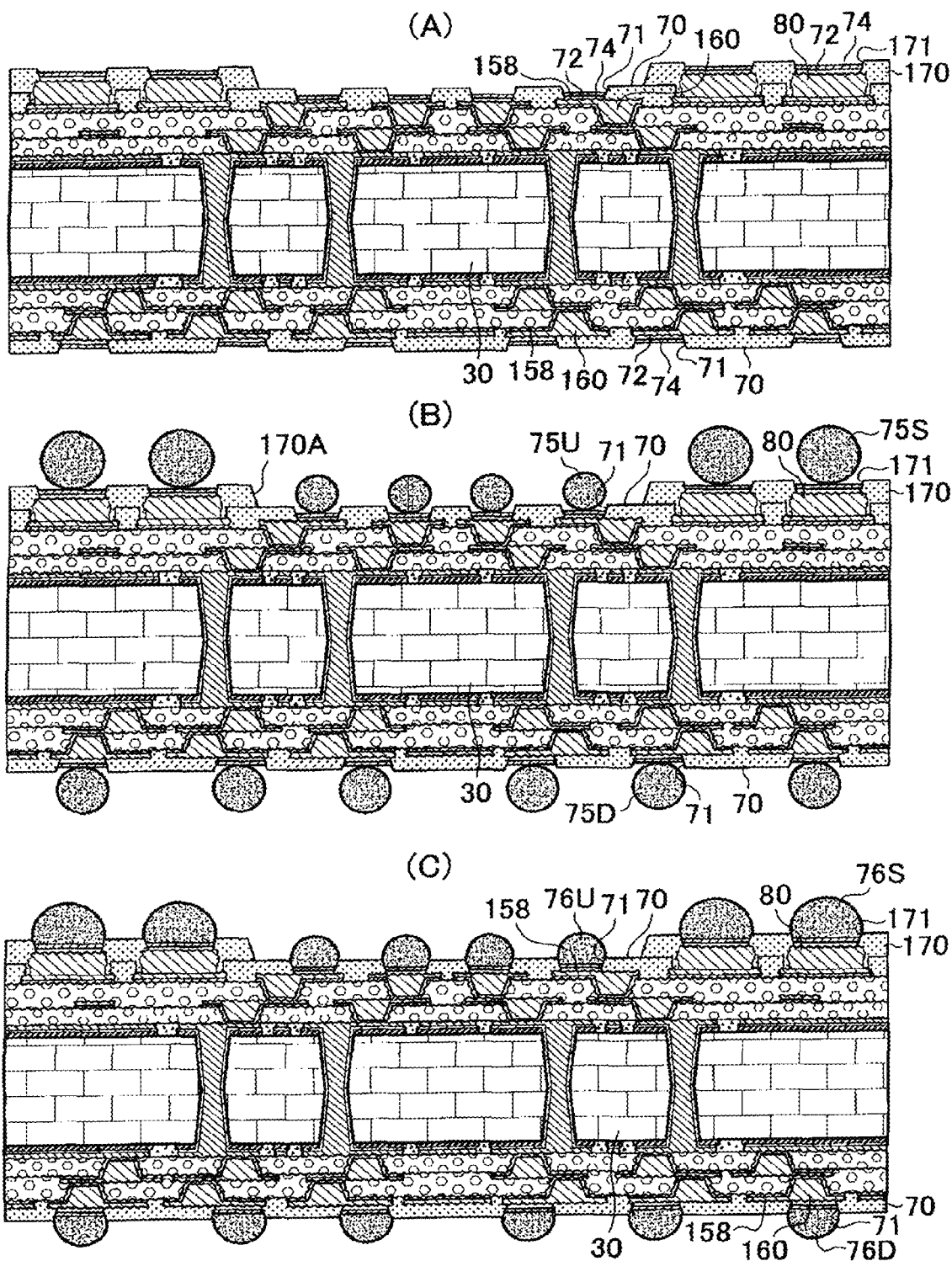
FIGS. 9(A)-9(C) are views of steps showing the method for manufacturing a package-substrate-mounting printed wiring board according to the first example.
Figure 10:
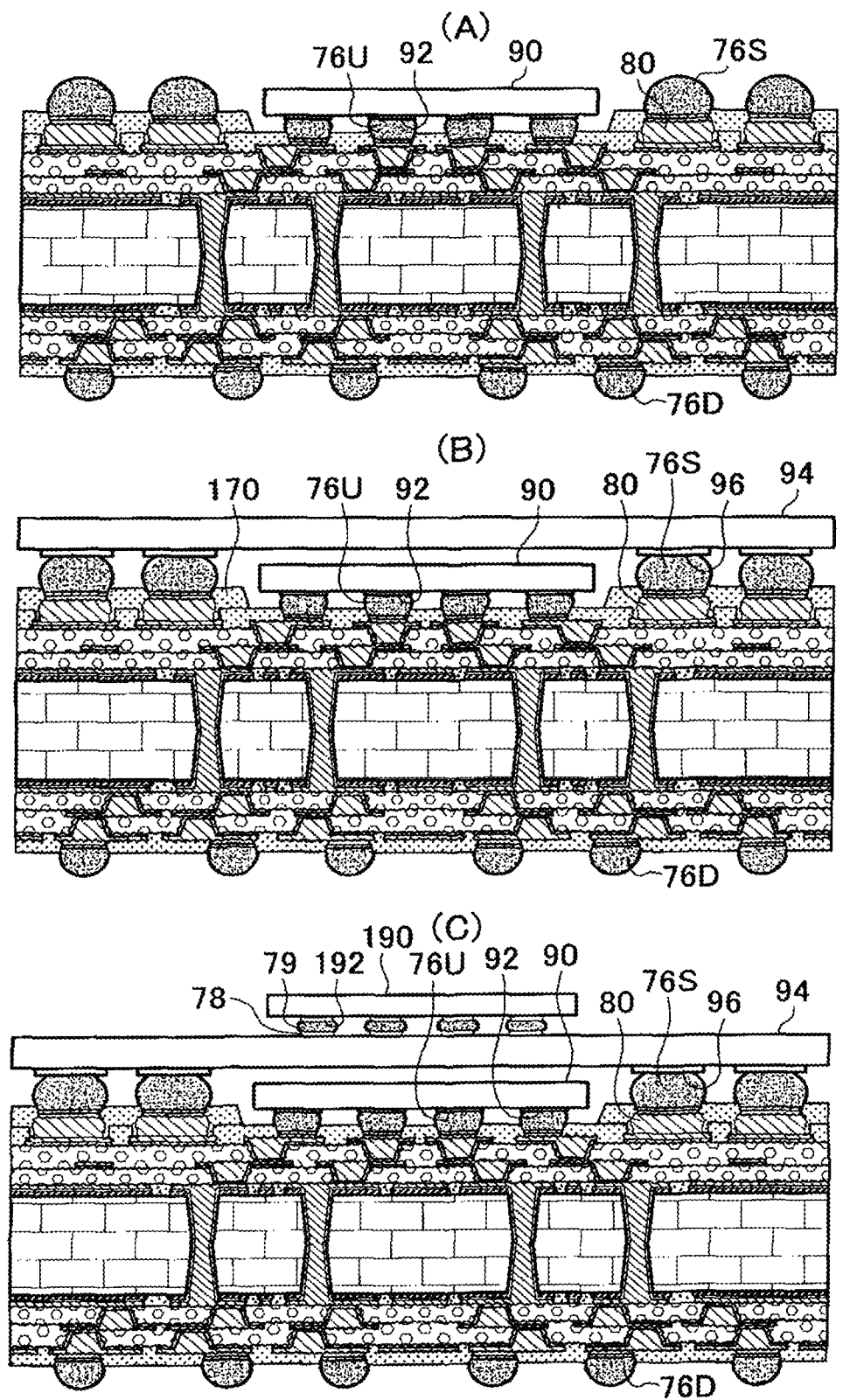
FIGS. 10(A)-10(C) are views of steps showing the method for manufacturing a package-substrate-mounting printed wiring board according to the first example.

The embodiments will now be described with reference to the accompanying drawings, wherein like reference numerals designate corresponding or identical elements throughout the various drawings.

Figure 11:
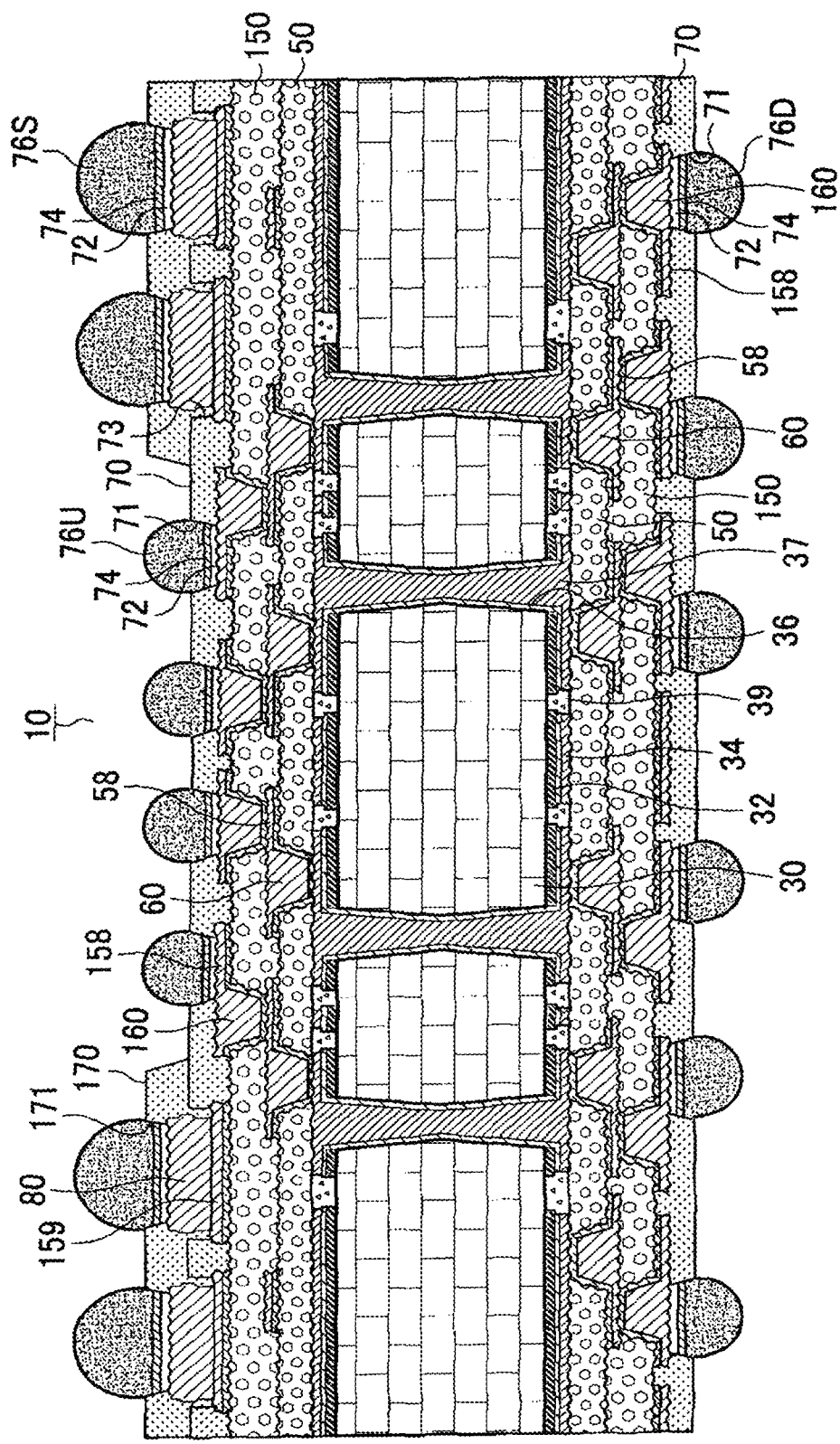
FIG. 11 is a cross-sectional view of a package-substrate-mounting printed wiring board before mounting an IC chip and a package substrate.
Figure 12:
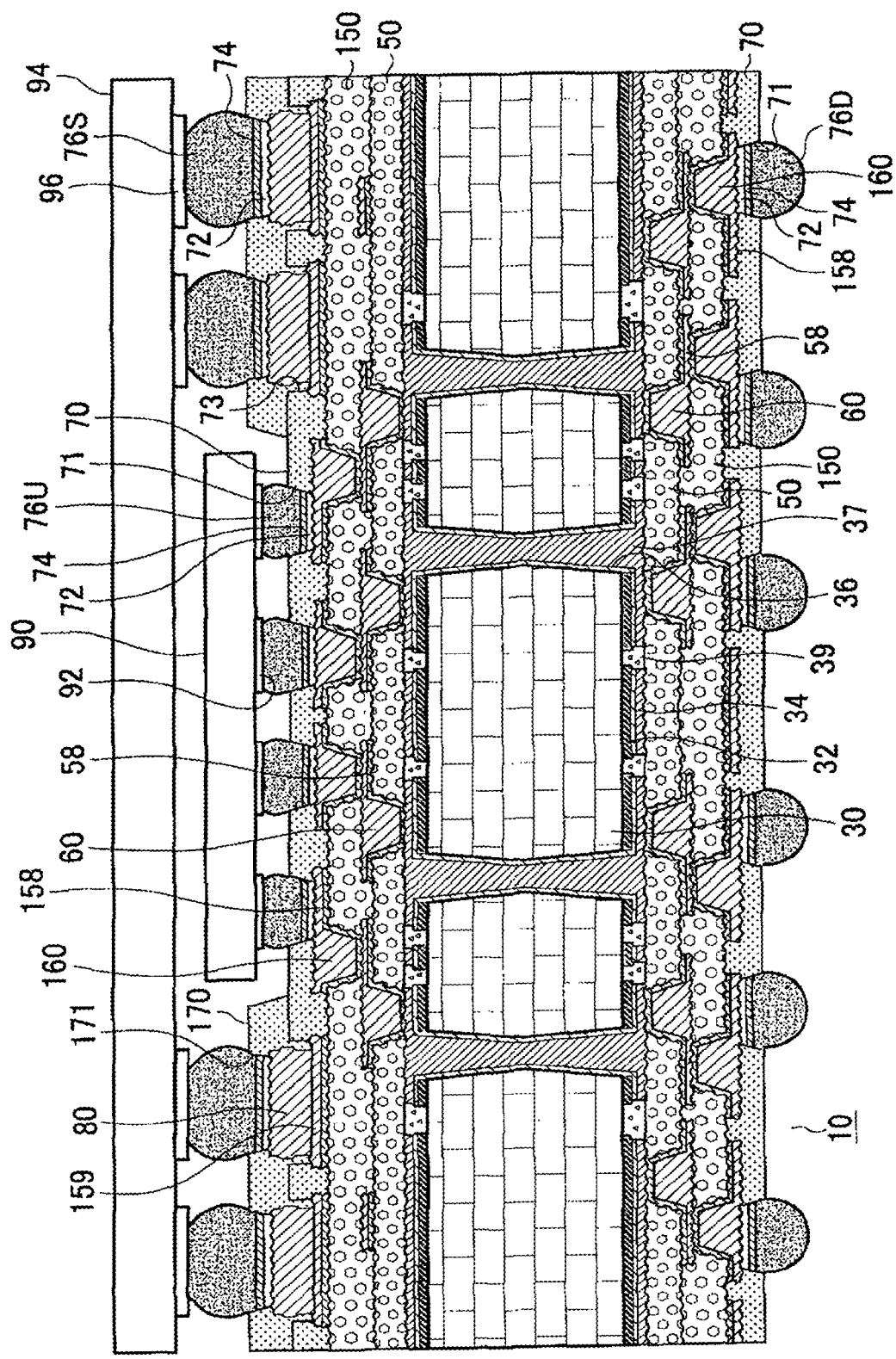
FIG. 12 is a cross-sectional view of the package-substrate-mounting printed wiring board shown in FIG. 11 on which an IC chip and a package substrate are mounted.

With reference to FIGS. 11 and 12, following is a description of a package-substrate-mounting printed wiring board according to a first example of the present invention.

FIG. 11 shows package-substrate-mounting printed wiring board 10 prior to mounting an IC chip and a package substrate. FIG. 12 shows a state in which IC chip 90 and package substrate 94 are mounted on package-substrate-mounting printed wiring board 10 shown in FIG. 11. IC chip 90 is mounted on package-substrate-mounting printed wiring board 10 by connecting pad 92 of IC chip 90 through first bump (76U). Package substrate 94 is mounted on package-substrate-mounting printed wiring board 10 by connecting terminal 96 of the package substrate through second bump (76S).

Package-substrate-mounting printed wiring board 10 is formed by building up interlayer insulation layers (50, 150), conductive circuits 58 and conductive circuits 158 (first pads) on both surfaces of core substrate 30 through lamination.

In package-substrate-mounting printed wiring board 10, conductive circuits 34 are formed on surfaces of core substrate 30. Conductive circuit 34 on a first surface (upper surface) of core substrate 30 is connected to conductive circuit 34 on a second surface (lower surface) by through-hole conductor 36. Through-hole conductor 36 is filled with metal. On conductive circuit 34 of the core substrate, interlayer insulation layer 50 is formed, having via conductor 60 and conductive circuit 58, and interlayer insulation layer 150 is formed, having via conductor 160, first pad 158 and second pad 159. Conductive post 80 is formed on second pad 159 which is arranged along the periphery of the first pad group. First solder-resist layer 70 is formed on via conductor 160, first pad 158 and second pad 159. In first opening portions 71 of first solder-resist layer 70, first bump (76U) is formed on via conductor 160 or first pad 158 in the central area of the first surface, and solder bump (76D) is formed on the second surface. First solder-resist layer 70 has second opening portion 73 which partially exposes second pad 159 and exposes conductive post 80. First solder-resist layer 70 is formed on interlayer insulation layer 150, and second solder-resist layer 170 is further formed on first solder-resist layer 70. Second solder-resist layer 170 is filled between the inner wall of a second opening portion and a conductive post. In second solder-resist layer 170, third opening portion (170A) is formed to expose the first pad group, and fourth opening portion 171 to expose the upper surface of conductive post 80. Second bump (76S) is formed in fourth opening portion 171 of second solder-resist layer 170.

Figure 13:
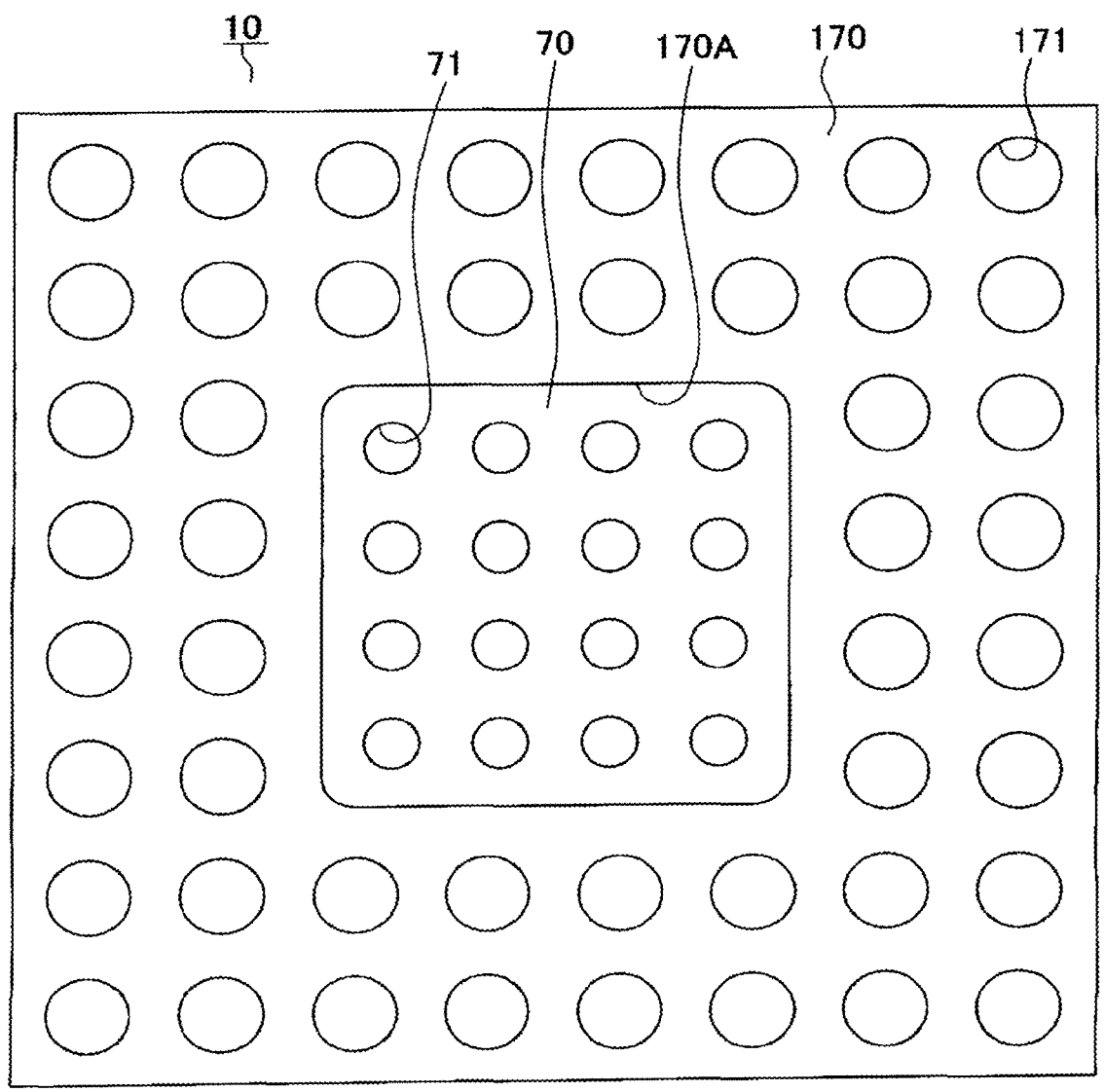
FIG. 13 is a plan view of the package-substrate-mounting printed wiring board shown in FIG. 8(C)

FIG. 13 shows a plan view of package-substrate-mounting printed wiring board 10 prior to loading solder balls. Second solder-resist layer 170 is formed along the periphery of package-substrate-mounting printed wiring board 10, and has third opening portion (170A) in the central area. Fourth opening portion 171 for accommodating second bump (76S) is formed along the periphery of package-substrate-mounting printed wiring board 10. In first solder-resist layer 70, first opening portion 71 for positioning first bump (76U) is formed in the central area of package-substrate-mounting printed wiring board 10.

Figure 14:
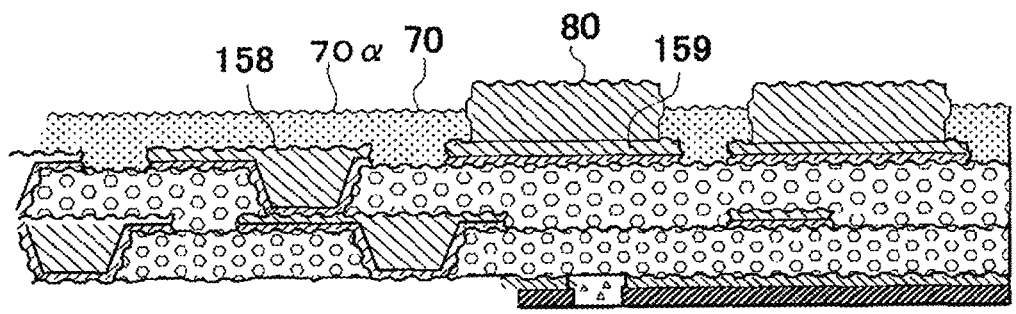
FIG. 14(A) is a magnified cross-sectional view showing a surface of the first solder-resist layer before exposure and development.
FIG. 14(B) is a magnified cross-sectional view showing a conductive post.
Figure 14:
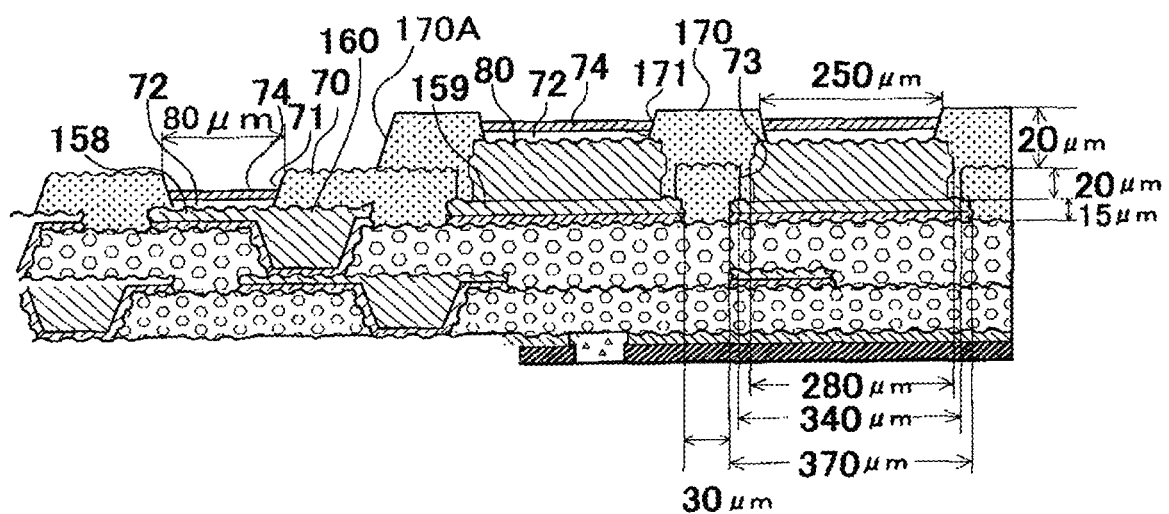

FIG. 14(B) is a magnified view of conductive post 80 before second bump (76S) is formed. Conductive post 80 is formed on second pad 159. The thickness of second pad 159 is set at 15 μm. The thickness from the upper surface of second pad 159 to a surface of first solder-resist layer 70 is set at 20 μm. The thickness of second solder-resist layer 170 is set at 20 μm. Namely, conductive post 80 is accommodated in a 55 μm-thick portion, which is the sum of thicknesses of first solder-resist layer 70 and second solder-resist layer 170. A fourth opening portion with an opening diameter of 250 μm is formed on the upper surface of conductive post 80. The diameter of conductive post 80 is set at 280 μm. The diameter of second opening portion 73 in first solder-resist layer 70 is set at 340 μm. The diameter of second pad 159 is set at 370 μm. The peripheral area of second pad 159 is covered by first solder-resist layer 70 for a distance of 30 μm from the outermost periphery toward the center, and second pad 159 is further covered by second solder-resist layer 170 at the bottom of the second opening portion. The diameter of first opening portion 71 is set at 80 μm.

The clearance between conductive post 80 and second opening portion 73 is set at 30 μm. Namely, second opening portion 73 is formed in first solder-resist layer 70 along the periphery of conductive post 80 for a distance of 30 μm from the periphery of conductive post 80 to an inner wall of second opening portion 73, and second solder-resist layer 170 on first solder-resist layer 70 is filled between the inner wall of the second opening portion and the conductive post. In setting so, conductive post 80 does not contact the connecting boundary of first solder-resist layer 70 and second solder-resist layer 170, which is thought to become a likely origination point for peeling. Accordingly, because of the anchoring effect of the second solder-resist layer, peeling seldom occurs at the connecting surface where the second solder-resist layer is formed on the first solder-resist layer, and reliability is enhanced.

In addition, while second pad 159 is in contact with first solder-resist layer 70, it is also in contact with second solder-resist layer 170 through second opening portion 73 of first solder-resist layer 70. Second pad 159 is hardly removed from interlayer insulation layer 150 because it is covered by two solder-resist layers, and thus its reliability is enhanced.

The opening diameter of fourth opening portion 171 is set at 250 μm in the first example. Since the diameter of conductive post 80 is set at 280 μm, the peripheral area of the surface of conductive post 80 is covered by the second solder-resist layer for 15 μm from the outermost periphery toward the center (FIG. 14(B)). In such a case, adhesiveness is enhanced between conductive post 80 and the second solder-resist layer at the contact area of conductive post 80 and second bump (76S), which is largely affected by stress. After conductive post 80 is formed, the entire surface is covered by second solder-resist layer 170, and fourth opening portion 171 is formed through exposure and development. Accordingly, the opening diameter of fourth opening portion 171 is made smaller than the diameter of the conductive post. Therefore, adhesiveness with second bump (76S) is secured against thermal stress and its reliability is enhanced.

Figure 15:
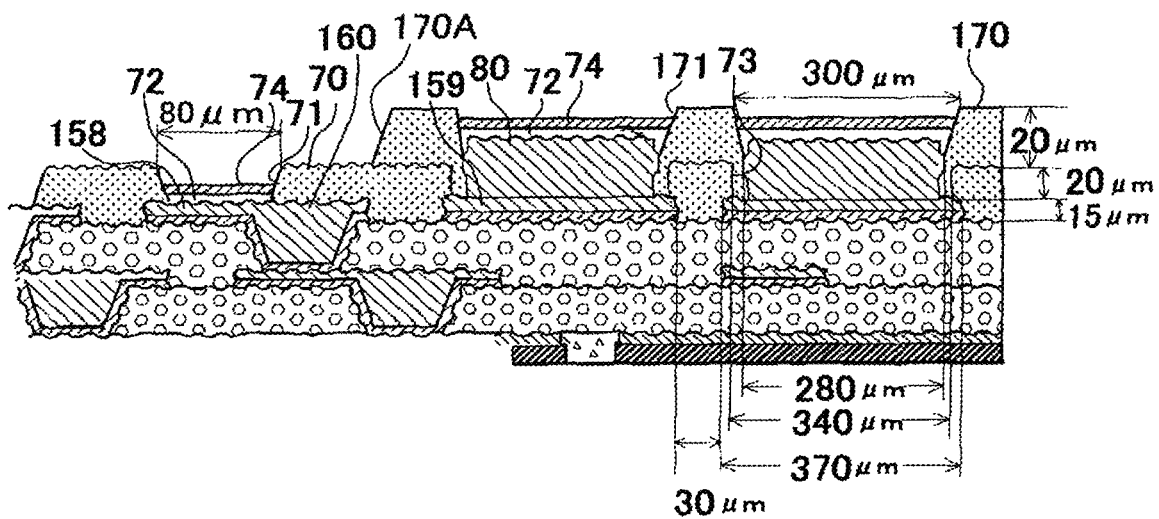
FIG. 15 is a magnified cross-sectional view showing another example of a conductive post.

However, the above first example is not the only option. The opening diameter of fourth opening portion 171 may be set greater than the diameter of conductive post 80. In such a case, in addition to its upper surface, part of a side surface of conductive post 80 is also exposed (FIG. 15). When second bump (76S) is formed in fourth opening portion 171, second bump (76S) makes contact with part of the side surface of conductive post 80 in addition to its upper surface. Accordingly, adhesiveness is enhanced between conductive post 80 and second bump (76S), which are largely affected by stress.

In the package-substrate-mounting printed wiring board of the first example, since the same resin is used for first solder-resist layer 70 and second solder-resist layer 170, the thermal expansion coefficient of the first solder-resist layer is the same as that of the second solder-resist layer; thus, peeling seldom occurs during heat cycles. In addition, lower cost is achieved by using the same resin.

When second solder-resist layer 170 is laminated on first solder-resist layer 70 in the method for manufacturing a package-substrate-mounting printed wiring board according to the first example, first solder-resist layer 70 is not thermally cured after first opening portion 71 and second opening portion 73 are formed. Namely, second solder-resist layer 170 is laminated on uncured first solder-resist layer 70. Third opening portion (170A) and fourth opening portion 171 are formed in second solder-resist layer 170 after it is laminated on uncured first solder-resist layer 70. After third opening portion (170A) and fourth opening portion 171 are formed, first solder-resist layer 70 and second solder-resist layer 170 are thermally cured simultaneously. Since the surface of uncured first solder-resist layer 70 is highly adhesive, second solder-resist layer 170 is securely adhered. Moreover, by thermally curing first solder-resist layer 70 and second solder-resist layer 170 at the same time, thermal damage to the printed wiring board is reduced, while productivity is enhanced since the curing process is conducted in one step.

In package-substrate-mounting printed wiring board 10 of the first example, package substrate 94 is mounted on package-substrate-mounting printed wiring board 10 through conductive post 80, which is formed on outermost second pad 159 positioned along the periphery on the first-surface side, and through second bump (76S) on conductive post 80. Accordingly, clearance is set by tall conductive post 80 without depending only on a solder bump to set the clearance. Accordingly, package-substrate-mounting printed wiring board 10 and package substrate 94 are connected by small-diameter second bump (76S), while clearance is secured between IC chip 90 and package substrate 94 to be mounted on package substrate 10. Since connection is obtained through small-diameter second bump (76S), the pitch of terminal 96 is set narrow, and high-density package substrate 94 is achieved.

By referring to FIGS. 1~11, the following describes a method for manufacturing package-substrate-mounting printed wiring board 10 described above with reference to FIG. 12.

(1) The starting material is copper-clad laminate (30A), which is formed by laminating 5~35 μm-thick copper foil 32 on both surfaces of insulative substrate 30 made of glass epoxy resin or BT (bismaleimide triazine) resin with a thickness of 0.2~0.8 mm (FIG. 1(A)).

(2) First, a laser is used to form penetrating hole 33 for a through hole in copper-clad laminate (30A), and plated film 31 is formed through electroless plating (FIG. 1(B)).

(3) Plating resist 28 with a predetermined pattern is formed (FIG. 1(C)).

(4) Electrolytic plating is performed to form electrolytic plated film 35 on portions where plating resist 28 is not formed, and electrolytic plating is filled in penetrating hole 33 for a through hole (FIG. 1(D)).

(5) The plating resist is removed, and plated film 31 and copper foil 32 under the plating resist are etched away to form conductive circuits 34 on both surfaces of the substrate, through-hole conductor 36 in penetrating hole 33 for a through hole, and roughened layer (35β) (FIG. 1(E)).

(6) A layer of resin filler 39 is formed on the substrate where conductive circuits are not formed, and conductive layers 34 are polished (FIG. 2(A)).

(7) After washing with water and acid degreasing are conducted, the substrate is soft etched and an etching solution is sprayed on both surfaces of the substrate. Accordingly, surfaces of conductive circuits 34 and land surfaces of through-hole conductor 36 are etched to form roughened surface (34β) on the entire surface of the conductive circuits (FIG. 2(B)).

(8) After the above procedure, 50 μm-thick resin film for interlayer insulation layers with a size slightly greater than the core substrate is vacuum pressed to be laminated on both surfaces of core substrate 30, while temperatures are increased from 50 to 150° C.

Accordingly, interlayer insulation layers 50 are formed (FIG. 2(C)).

(9) Next, a CO2 gas laser is used to form via opening portions 51 with an opening diameter of 80 μm in interlayer resin insulation layers 50 (FIG. 2(D)).

(10) Next, the substrate is immersed in an oxidizing agent such as chromic acid or permanganate to form roughened surface (50β) on interlayer insulation layers 50 (FIG. 3(A)).

(11) A catalyst such as palladium is attached on surface layers of interlayer insulation layers 50, and the substrate is immersed in an electroless plating solution for 5~60 minutes to form electroless plated film 52 with a thickness of 0.1~5 μm (FIG. 3(B)).

(12) After the above process, a commercially available photosensitive dry film is laminated on substrate 30, exposed to light with a photomask placed thereon, and developed with sodium carbonate to form 15 μm-thick plating resist 54 (FIG. 3(C)).

(13) Electrolytic plating is performed to form 15 μm-thick electrolytic plated film 56 (FIG. 4(A)).

(14) After plating resist 54 is removed by 5% NaOH, electroless plated film 52 under the plating resist is dissolved and removed by etching using a mixed solution of nitric acid, sulfuric acid and hydrogen peroxide to form 15 μm-thick conductive circuit 58 and via conductor 60 made of electroless plated film 52 and electrolytic plated film 56 (FIG. 4(B)). Using an etching solution containing copper (II) complex and organic acid, roughened surface (58β) is formed on surfaces of conductive circuit 58 and via conductor 60 (FIG. 4(C)).

(15) The same as (8) and (9) above, upper interlayer insulation layers 150 with opening portions 151 are formed (FIG. 4(D)), and electroless plated film 152 to become electrolytic plating seed is formed on interlayer insulation layers 150 the same as (11) above (FIG. 5(A)). Plating resist 154 with a predetermined pattern is formed the same as (12) above (FIG. 5(B)), and electrolytic plated film 156 is formed the same as (13) above (FIG. 5C)).

(16) Plating resist 154 is removed the same as (14) above to form 15 μm-thick first pad 158, second pad 159 and via conductor 160 made of electroless plated film 152 and electrolytic plated film 156 (FIG. 6(A)). The diameter of second pad 159 is set at 370 μm. Here, to form later-described conductive post 80, electroless plated film 152 is not removed.

(17) Plating resist is applied on the substrate surfaces, and is exposed and developed to form plating resist 254 having opening (254a) corresponding to a conductive post described above with reference to FIG. 12 (FIG. 6(B)). Opening (254a) is formed on second pad 159 so that the center of opening portion (254a) aligns with the center of second pad 159.

(18) Current is flowed through electroless plated film 152 as a shield layer to fill electrolytic plating 157 in opening portion (254a) on second pad 159 (FIG. 6(C)).

(19) After plating resist 254 is removed, electroless plated film 152 under the plating resist is etched away so that conductive post 80 is formed on second pad 159 (FIG. 7A)). Using an etching solution containing copper (II) complex and organic acid, roughened surface (80β) is formed on surfaces of conductive post 80, first pad 158, second pad 159 and via conductor 160 (FIG. 7(B)). The diameter of conductive post 80 is set at 280 μm, and conductive post 80 is formed in such a way that the center of the diameter of conductive post 80 aligns with the center of the diameter of second pad 159.

(20) Then, after the above process, 35 μm-thick first solder-resist layer 70 is laminated on the substrate surfaces. At that time, first solder-resist layer 70 is laminated so that the entire surface of the first and second pads and part of conductive post 80 are exposed (FIG. 14(A)). Through exposure and development, first opening portion 71 with a diameter of 80 μm is formed, and simultaneously, second opening portion 73 with a diameter of 340 μm is formed to surround conductive post 80 so that a clearance of 30 μm is formed along the periphery of conductive post 80 (FIG. 8(A)). The center of the diameter of second opening portion 73 is set to align with the center of second pad 159. Upper and side surfaces of conductive post 80 are exposed through second opening portion 73. At that time, first solder-resist layer 70 is uncured.

(21) On uncured first solder-resist layer 70, 20 μm-thick second solder-resist layer 170 is laminated (FIG. 8(B)). During that time, part of second solder-resist layer 170 is filled between an inner wall of second opening portion 73 and conductive post 80. At that time, conductive post 80 does not contact a connecting boundary of first solder-resist layer 70 and second solder-resist layer 170, which is thought to be a likely origination point for peeling. Accordingly, peeling seldom occurs at the connecting surface where the second solder-resist layer is formed on the first solder-resist layer due to the anchoring effect of the second solder-resist layer. Therefore, reliability is enhanced. In addition, second pad 159 is in contact with first solder-resist layer 70, while being in contact with second solder-resist layer 170 through second opening portion 73 of first solder-resist layer 70. By being double covered by solder-resist layers (70, 171), second pad 159 is seldom removed from interlayer insulation layer 150, and reliability is enhanced.

(22) Through exposure and development, second solder-resist layer 170 is formed to have third opening portion (170A) in the central area of the substrate to expose first opening portion 71 of first solder-resist layer 70, along with fourth opening portion 171 to expose the upper surface of conductive post 80 (FIG. 8(C)). The opening diameter of fourth opening portion 171 is set at 250 μm. Since the diameter of conductive post 80 is set at 280 μm, the peripheral area of the upper surface of conductive post 80 is covered by second solder-resist layer 170 for 15 μm from the outermost periphery toward the center. In such a case, adhesiveness is enhanced between conductive post 80 and the second solder-resist layer at the contact area between conductive post 80 and second bump (76S), which is largely affected by stress. In addition, the above first example is not the only option, and fourth opening portion 171 may have an opening diameter greater than the 280-μm diameter of conductive post 80. In such a case, not only the upper surface, but part of a side surface of conductive post 80 is also exposed (see FIG. 15). When second bump (76S) is formed in fourth opening portion 171, second bump (76S) makes contact with part of the side surface of conductive post 80 along with its upper surface. Thus, adhesiveness is enhanced between conductive post 80 and second bump (76S), which are largely affected by stress.

(23) First solder-resist layer 70 and second solder-resist layer 170 are thermally cured simultaneously (omitted in the drawings). When second solder-resist layer 170 is laminated on first solder-resist layer 70, first solder-resist layer 70 is not thermally cured after first opening portion 71 and second opening portion 73 are formed. Namely, second solder-resist layer 170 is laminated on uncured first solder-resist layer 70. Third opening portion (170A) and fourth opening portion 171 are formed in second solder-resist layer 170 after it is laminated on uncured first solder-resist layer 70. First solder-resist layer 70 and second solder-resist layer 170 are thermally cured simultaneously after third opening portion (170A) and fourth opening portion 171 are formed. Since the surface of uncured first solder-resist layer 70 is highly adhesive, it is securely adhered to second solder-resist layer 170. Furthermore, since first solder-resist layer 70 and second solder-resist layer 170 are thermally cured simultaneously, thermal damage is reduced in the printed wiring board and productivity is enhanced because the curing process is done in one step.

(24) The substrate is immersed in an electroless nickel plating solution to form 5 μm-thick nickel-plated film in first opening portion 71 and fourth opening portion 171. Then, the substrate is immersed in an electroless gold plating solution to form a 0.03 μm-thick gold-plated layer on the nickel-plated layer (FIG. 9(A)). Instead of nickel-gold layers, nickel-palladium-gold layers may also be formed.

(25) After that, solder ball (75U) with a smaller diameter is loaded in first opening portion 71 using a mask for loading solder balls. Such a mask for loading solder balls has a concave portion corresponding to third opening portion (170A) in second solder-resist layer 170, and there is a hole corresponding to first opening portion 71 at the bottom of the concave portion. Then, using their respective flat masks for loading solder balls, solder ball (75S) with a larger diameter is loaded in fourth opening portion 171, and solder ball (75D) with a medium diameter is loaded in opening 71 on the second-surface side (bottom portion) (FIG. 9(B)).

(26) A reflow is conducted so that a package-substrate-mounting printed wiring board is manufactured to have first bump (76U) in first opening portion 71 on the first-surface (upper-surface) side, second bump (76S) in fourth opening portion 171, and solder bump (76D) in opening 71 on the second-surface (bottom-surface) side (FIG. 9(C), FIG. 11). In the present example, the diameter of second bump (76S) is greater than that of first bump (76U).

IC chip 90 is mounted on the package-substrate-mounting printed wiring board (FIG. 10(A)) by connecting pad 92 of IC chip 90 through first bump (76U). Package substrate 94 is mounted on the package-substrate-mounting printed wiring board by connecting pad 96 of package substrate 94 through second bump (76S) (FIG. 10(B)). FIG. 10(C) shows an example of package substrate 94 with mounted IC chip 190.

In the method for manufacturing a package-substrate-mounting printed wiring board according to the first example, first solder-resist layer 70 is formed to have second opening portion 73 along the periphery of conductive post 80, and second solder-resist layer 170 is filled in second opening portion 73 while second solder-resist layer 170 is formed on first solder-resist layer 70. Namely, second opening portion 73 is formed in first solder-resist layer 70 to surround the periphery of a conductive post, and second solder-resist layer 170 on the first solder-resist layer is filled between an inner wall of second opening portion 73 of the first solder-resist layer and the conductive post. Thus, due to the anchoring effect in such a portion, peeling seldom occurs at the connecting surface where the second solder-resist layer is formed on the first solder-resist layer, and reliability is enhanced.

When second solder-resist layer 170 is laminated on first solder-resist layer 70 in the method for manufacturing a package-substrate-mounting printed wiring board according to the first example, first solder-resist layer 70 is not thermally cured after first opening portion 71 and second opening portion 73 are formed. Namely, second solder-resist layer 170 is laminated on uncured first solder-resist layer 70. Third opening portion (170A) and fourth opening portion 171 are formed in second solder-resist layer 170 after it is laminated on uncured first solder-resist layer 70. First solder-resist layer 70 and second solder-resist layer 170 are thermally cured simultaneously after third opening portion (170A) and fourth opening portion 171 are formed. Since the surface of uncured first solder-resist layer 70 is highly adhesive, it is securely adhered to second solder-resist layer 170. Furthermore, since first solder-resist layer 70 and second solder-resist layer 170 are thermally cured simultaneously, thermal damage is reduced in the printed wiring board, while productivity is enhanced because the curing process is done in one step.

In the method for manufacturing a package-substrate-mounting printed wiring board according to the first example, the same resin is used for first solder-resist layer 70 and second solder-resist layer 170. Thus, the thermal expansion coefficient of first solder-resist layer 70 is the same as that of second solder-resist layer 170, and peeling seldom occurs during heat cycles. Also, low cost is achieved by using the same resin.

In the method for manufacturing a package-substrate-mounting printed wiring board according to the first example, plating resist 254 is formed having opening (254a) which corresponds to the location for forming conductive post 80 (FIG. 6(B)), electrolytic plating 157 is filled in opening (254a) of plating resist 254 (FIG. 6(C)), and conductive post 80 is formed by removing plating resist 254. After that, first solder-resist layer 70 and second solder-resist layer 170 are formed. Plating resist 254 for electrolytic plating is removed, and the first solder-resist layer and the second solder-resist layer are formed without requiring plating. Therefore, durable and highly reliable resin material can be selected for the first and second solder-resist layers. Since conductive post 80 is formed using shield layer 152 for electrolytic plating (electrolytic plated film), which is used for forming first pad 158 and second pad 159, another shield layer is not required for the conductive post. Therefore, a step is omitted while reliability is enhanced.

The features of a printed wiring board according to an embodiment of the present invention are as follows: an interlayer insulation layer; a first pad group which is arranged on the interlayer insulation layer and is formed with multiple first pads for mounting a semiconductor element; a second pad group which is arranged on the interlayer insulation layer along the periphery of the first pad group and is formed with multiple second pads; a first solder-resist layer which is formed on the interlayer insulation layer and has a first opening portion to partially expose a first pad and a second opening portion to partially expose a second pad; a conductive post to be formed on a second pad; and a second solder-resist layer which is formed on the first solder-resist layer and has a third opening portion to expose the first pad group and a fourth opening portion to expose the upper surface of the conductive post. In such a printed wiring board, the diameter of the second opening portion is set greater than the diameter of the conductive post, and the second solder-resist layer is filled between an inner wall of the second opening portion and the conductive post.

In the printed wiring board described above, since the second solder-resist layer is filled between an inner wall of a second opening portion and a conductive post, peeling seldom occurs at a connecting surface between the first solder-resist layer and the second solder-resist layer. Thus, connection reliability with the upper substrate is enhanced.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   an interlayer insulation layer;
   a plurality of first pads positioned to mount a semiconductor element and forming a first pad group on the interlayer insulation layer;
   a plurality of second pads forming a second pad group on the interlayer insulation layer and positioned along a peripheral portion of the first pad group;
   a first solder-resist layer formed on the interlayer insulation layer and having a plurality of first opening portions exposing portions of the first pads, respectively, and a plurality of second opening portions exposing portions of the second pads, respectively;
   a plurality of conductive posts formed on the plurality of second pads through the plurality of second opening portions of the first solder-resist layer, respectively; and
   a second solder-resist layer formed on the first solder-resist layer and having a third opening portion exposing the plurality of first pads and a plurality of fourth opening portions exposing surface portions of the conductive posts, respectively,
   wherein the plurality of second opening portions has a diameter which is set greater than a diameter of the plurality of conductive posts, and the second solder-resist layer is filling gaps formed between the second opening portions and the conductive posts.

2. The printed wiring board according to claim 1, wherein the first solder-resist layer and the second solder-resist layer have the same composition.

3. The printed wiring board according to claim 1, further comprising:
   a plurality of first bumps formed in the plurality of first opening portions of the first solder-resist layer, respectively; and
   a plurality of second bumps formed in the plurality of fourth opening portions of the second solder-resist layer, respectively.

4. The printed wiring board according to claim 1, wherein the plurality of fourth opening portions of the second solder-resist layer has diameters which are set greater than diameters of the plurality of first opening portions of the first solder-resist layer.

5. The printed wiring board according to claim 1, wherein the surface portions of the conductive posts have peripheral portions covered by the second solder-resist layer.

6. The printed wiring board according to claim 1, wherein the plurality of fourth opening portions exposes the surface portions and side portions of the conductive posts.

7. The printed wiring board according to claim 1, wherein the plurality of second pads is in contact with the first solder-resist layer and the second solder-resist layer.

8. The printed wiring board according to claim 1, wherein the plurality of conductive posts is in contact with the second solder-resist layer and is not in contact with the first solder-resist layer.

9. The printed wiring board according to claim 1, wherein the plurality of second pads is positioned to mount a package substrate over the semiconductor element mounted on the plurality of first pads.

10. A method for manufacturing a printed wiring board, comprising:
    forming on an interlayer insulation layer a plurality of first pads positioned to mount a semiconductor element such that the plurality of first pads forms a first pad group;
    forming a plurality of second pads along a peripheral portion of the first pad group such that the plurality of second pads forms a second pad group on the interlayer insulation layer;

forming on the interlayer insulation layer a first solder-resist layer having a plurality of first opening portions such that the first opening portions expose at least portions of the first pads, respectively, and a plurality of second opening portions such that the second opening portions expose at least portions of the second pads, respectively;

forming a plurality of conductive posts on the plurality of second pads through the plurality of second opening portions of the first solder-resist layer, respectively; and forming on the first solder-resist layer a second solder-resist layer having a third opening portion such that the third opening portion exposes the first pad group and a plurality of fourth opening portions such that the fourth opening portions expose surface portions of the conductive posts, respectively, wherein the plurality of second opening portions has a diameter which is set greater than a diameter of the plurality of conductive posts, and the forming of the second solder-resist layer comprises filling gaps formed between the second opening portions and the conductive posts.

11. The method for manufacturing a printed wiring board according to claim 10, wherein the first solder-resist layer and the second solder-resist layer have the same composition.

12. The method for manufacturing a printed wiring board according to claim 10, further comprising:
forming a plurality of first bumps in the plurality of first opening portions of the first solder-resist layer; and
forming a plurality of second bumps in the plurality of fourth opening portions of the second solder-resist layer.

13. The method for manufacturing a printed wiring board according to claim 10, wherein the forming of the second solder-resist layer comprises forming the plurality of fourth opening portions such that the plurality of fourth opening portions has diameters which are set greater than diameters of the plurality of first opening portions of the first solder-resist layer.

14. The method for manufacturing a printed wiring board according to claim 10, wherein the forming of the second solder-resist layer comprises forming the plurality of fourth opening portions such that the plurality of fourth opening portions exposes only the surface portions of the conductive posts, respectively.

15. The method for manufacturing a printed wiring board according to claim 10, wherein the forming of the second solder-resist layer comprises forming the plurality of fourth opening portions such that the plurality of fourth opening portions exposes the surface portions and side portions of the conductive posts.

16. The method for manufacturing a printed wiring board according to claim 10, wherein the forming of the first solder-resist layer comprises forming of the first solder-resist layer such that the plurality of second pads is in contact with the first solder-resist layer, and the forming of the second solder-resist layer comprises forming of the second solder-resist layer such that the plurality of second pads is in contact with the second solder-resist layer.

17. The method for manufacturing a printed wiring board according to claim 10, wherein the forming of the conductive posts comprises forming the conductive posts such that the plurality of conductive posts is in contact with the second solder-resist layer and is not in contact with the first solder-resist layer.

18. The method for manufacturing a printed wiring board according to claim 10, wherein the forming of the second solder-resist layer comprises laminating a solder-resist layer for forming the second solder-resist layer on the first solder-resist layer which is uncured.

19. The method for manufacturing a printed wiring board according to claim 10, wherein the first solder-resist layer and the second solder-resist layer are thermally cured simultaneously.

20. The method for manufacturing a printed wiring board according to claim 10, wherein the forming of the first solder-resist layer comprises exposing and developing the first solder-resist layer such that the first opening portions and the second opening portions are formed, and the forming of the second solder-resist layer comprises exposing and developing the second solder-resist layer such that the third opening portion and the fourth opening portions are formed.

* * * * *